(12) United States Patent
Eitoku

(10) Patent No.: US 7,494,549 B2
(45) Date of Patent: Feb. 24, 2009

(54) SUBSTRATE TREATMENT APPARATUS AND SUBSTRATE TREATMENT METHOD

(75) Inventor: Atsuro Eitoku, Kyoto (JP)

(73) Assignee: Dainippon Screen Mfg. Co., Ltd. (JP)

( * ) Notice: Subject to any disclaimer, the term of this patent is extended or adjusted under 35 U.S.C. 154(b) by 209 days.

(21) Appl. No.: 10/631,797

(22) Filed: Jul. 31, 2003

(65) Prior Publication Data

US 2004/0031503 A1   Feb. 19, 2004

(30) Foreign Application Priority Data

Aug. 16, 2002   (JP)   ............................. 2002-237586

(51) Int. Cl.
*B08B 3/00* (2006.01)
*B08B 3/02* (2006.01)
*B08B 3/04* (2006.01)
*B08B 3/08* (2006.01)
*B08B 7/00* (2006.01)
*B08B 7/04* (2006.01)

(52) U.S. Cl. ............................. 134/26; 134/30; 134/36; 134/94.1; 134/95.3; 134/102.2; 134/103.2; 134/902

(58) Field of Classification Search ............ 134/26, 134/30, 34, 36, 37, 902, 94.1, 95.1, 95.3, 134/102.1, 102.2, 103.2, 1.3, 1
See application file for complete search history.

(56) References Cited

U.S. PATENT DOCUMENTS

| | | | |
|---|---|---|---|
| 5,487,398 A * | 1/1996 | Ohmi et al. ................ | 134/95.1 |
| 6,431,185 B1 * | 8/2002 | Tomita et al. ............... | 134/1.3 |
| 2001/0042559 A1 * | 11/2001 | Mertens et al. .............. | 134/31 |
| 2002/0005214 A1 * | 1/2002 | Tomita et al. ............... | 134/36 |
| 2002/0035762 A1 * | 3/2002 | Okuda et al. ............... | 15/77 |
| 2002/0059947 A1 * | 5/2002 | Sato et al. ............... | 134/102.1 |

FOREIGN PATENT DOCUMENTS

| | | |
|---|---|---|
| JP | 6-5580 | 1/1994 |
| JP | 06-314679 | 11/1994 |
| JP | 8-155408 | 6/1996 |
| JP | 10-270403 | 10/1998 |
| JP | 11-260778 | 9/1999 |
| JP | 11-260779 | 9/1999 |
| JP | 2002-113429 | 4/2002 |

* cited by examiner

*Primary Examiner*—Alexander Markoff
(74) *Attorney, Agent, or Firm*—Ostrolenk, Faber, Gerb & Soffen, LLP

(57) ABSTRACT

A substrate treatment apparatus for removing an unnecessary substance from a surface of a substrate. The apparatus is provided with: an oxidation liquid supply mechanism for supplying an oxidation liquid having an oxidative effect to the substrate surface; a physical cleaning mechanism for physically cleaning the substrate surface; and an etching liquid supply mechanism for supplying an etching liquid having an etching effect to the substrate surface. It is preferred to physically clean the substrate surface while supplying the oxidation liquid to the substrate surface.

15 Claims, 4 Drawing Sheets

SUBSTRATE TREATMENT APPARATUS AND SUBSTRATE TREATMENT METHOD

BACKGROUND OF THE INVENTION

1. Field of the Invention

The present invention relates to a substrate treatment apparatus and a substrate treatment method for removing an unnecessary substance from a surface of a substrate. Examples of the substrate to be treated include semiconductor wafers, glass substrates for liquid crystal display devices, glass substrates for plasma display devices, substrates for optical disks, substrates for magnetic disks, substrates for magneto-optical disks and substrates for photo-masks.

2. Description of Related Art

Production processes for semiconductor devices and liquid crystal display devices often employ a substrate treatment apparatus for removing unnecessary substances such as particles and metal impurities (including unnecessary metal ions typified by copper ions) from a surface of a substrate. Where the substrate treatment apparatus is adapted to perform a treatment on a substrate-by-substrate basis, for example, ozone water and an HF (hydrofluoric acid) solution are alternately and repeatedly supplied to the substrate surface while the substrate is rotated within a generally horizontal plane. By the supply of the ozone water, an oxide film is formed on the substrate surface. By the subsequent supply of the HF solution, the particles on the substrate surface are removed together with the oxide film, and the metal impurities are removed from the substrate surface.

However, the particle removing effect of such a treatment depends on the amount of the etching of the oxide film by the HF solution. In order to provide a sufficient particle removing effect, a substrate surface etching amount should be increased, thereby requiring a longer process time.

Further, the substrate surface is liable to be over-etched in order to achieve the sufficient particle removing effect. If the substrate surface is over-etched, a hydrophobic base of the substrate is exposed, so that the particles once removed in the HF solution adhere again on the exposed hydrophobic base.

SUMMARY OF THE INVENTION

It is an object of the present invention to provide a substrate treatment apparatus and a substrate treatment method, wherein the substrate surface etching amount can be reduced without reducing the cleaning effect.

It is another object of the present invention to provide a substrate treatment apparatus and a substrate treatment method, wherein a substrate surface can be cleaned in a short period of time.

It is further another object of the present invention to provide a substrate treatment apparatus and a substrate treatment method, wherein the over-etching of a substrate surface can be prevented.

A substrate treatment apparatus according to the present invention is adapted to remove an unnecessary substance from a surface of a substrate. The substrate treatment apparatus comprises: an oxidation liquid supply mechanism for supplying an oxidation liquid having an oxidative effect to the substrate surface; a physical cleaning mechanism for physically cleaning the substrate surface; and an etching liquid supply mechanism for supplying an etching liquid having an etching effect to the substrate surface.

According to the present invention, the substrate surface can chemically be cleaned by supplying the oxidation liquid and the etching liquid to the substrate surface, i.e., metal impurities oxidized by the oxidation liquid can be etched away from the substrate surface by the etching liquid. In addition, particles can be removed from the substrate surface by the physical cleaning by means of the physical cleaning mechanism.

Three functions, i.e., the function of the oxidation liquid supply mechanism for the oxidation of the metal impurities and the functions of the etching liquid supply mechanism and the physical cleaning mechanism for the removal of the particles, are cooperative, so that the metal impurities and the particles can properly be removed from the substrate surface even with a smaller amount of the etching of the substrate surface by the etching liquid. Since the amount of the etching by the etching liquid can be reduced, the etching period and the concentration of the etching liquid can be reduced.

Further, the over-etching of the substrate surface can be prevented by reducing the etching period and the concentration of the etching liquid.

The process of supplying the oxidation liquid to the substrate surface and the process of physically cleaning the substrate surface may separately be performed (or one of these processes may precede the other process) However, the apparatus preferably further comprises a cleaning controller for controlling the oxidation liquid supply mechanism and the physical cleaning mechanism to physically clean the substrate surface while supplying the oxidation liquid to the substrate surface. The provision of the cleaning controller makes it possible to simultaneously perform the oxidation liquid supply process and the physical cleaning process, so that the time required for the substrate treatment can further be reduced.

The physical cleaning mechanism may comprise a dual fluid spray nozzle for blowing a gas on a treatment liquid ejected toward the substrate surface to generate a jet flow of droplets of the treatment liquid and supplying the jet flow to the substrate surface. In this case, the particles can physically be removed from the substrate surface by a kinetic energy (flow speed) of the jet flow of the treatment liquid droplets supplied from the dual fluid spray nozzle.

The physical cleaning mechanism may comprise an ultrasonic mechanism for imparting ultrasonic vibration to the treatment liquid supplied or to be supplied to the substrate surface. In this case, the particles can physically be removed from the substrate surface by the ultrasonic vibration imparted to the treatment liquid by the ultrasonic mechanism. The ultrasonic mechanism may comprise an ultrasonic nozzle for imparting the ultrasonic vibration to the treatment liquid and supplying the treatment liquid to the substrate surface, or a rod-shaped or plate-shaped ultrasonic vibrator to be brought into contact with a film of the treatment liquid supplied to the substrate surface for imparting the ultrasonic vibration to the treatment liquid.

The oxidation liquid supply mechanism may be adapted to supply a treatment liquid containing ozone water as the oxidation liquid to the substrate surface or to supply a treatment liquid containing hydrogen peroxide as the oxidation liquid to the substrate surface.

The physical cleaning mechanism is preferably adapted to apply a physical energy to the oxidation liquid supplied or to be supplied to the substrate surface by the oxidation liquid supply mechanism.

With this arrangement, the particles can physically be removed from the substrate surface by the physical energy applied to the oxidation liquid, and the metal impurities on the substrate surface can be oxidized by the oxidative effect of the oxidation liquid.

This arrangement permits the oxidation liquid supply mechanism to cooperate with the physical cleaning mechanism for the treatment of the substrate surface. More specifically, the oxidation liquid may first be imparted with the ultrasonic vibration by the ultrasonic nozzle and then supplied to the substrate surface. Alternatively, the oxidation liquid may first be supplied to the substrate surface and then imparted with the ultrasonic vibration by the ultrasonic vibrator. Further, the oxidation liquid may be mixed with the gas by the dual fluid spray nozzle and supplied in the form of droplets on the substrate surface.

A substrate treatment method according to the present invention is adapted to remove an unnecessary substance from a surface of a substrate. The substrate treatment method comprises the steps of: supplying an oxidation liquid having an oxidative effect to the substrate surface for oxidizing at least metal impurities on the substrate surface; physically cleaning the substrate surface; and supplying an etching liquid having an etching effect to the substrate surface for etching the substrate surface after the oxidation step and the physical cleaning step.

The oxidation step and the physical cleaning step may separately be carried out. However, the physical cleaning step may be carried out at least partly simultaneously with the oxidation step.

The oxidation step, the physical cleaning step and the etching step are preferably repeated a plurality of times. Thus, the metal impurities and particles can more cleanly be removed from the substrate surface. Where the aforesaid process sequence is repeated a plurality of times with the respective steps carried out for short periods, the cleaning effect can be improved as compared with a case where the process sequence is performed once for a longer period The etching step is preferably carried out for a period necessary and sufficient to etch away the metal impurities from the substrate surface in the oxidation step. Thus, the over-etching of the substrate surface can be prevented.

The foregoing and other objects, features and effects of the present invention will become more apparent from the following description of the preferred embodiments with reference to the attached drawings.

DESCRIPTION OF THE PREFERRED EMBODIMENTS

Figure 1:
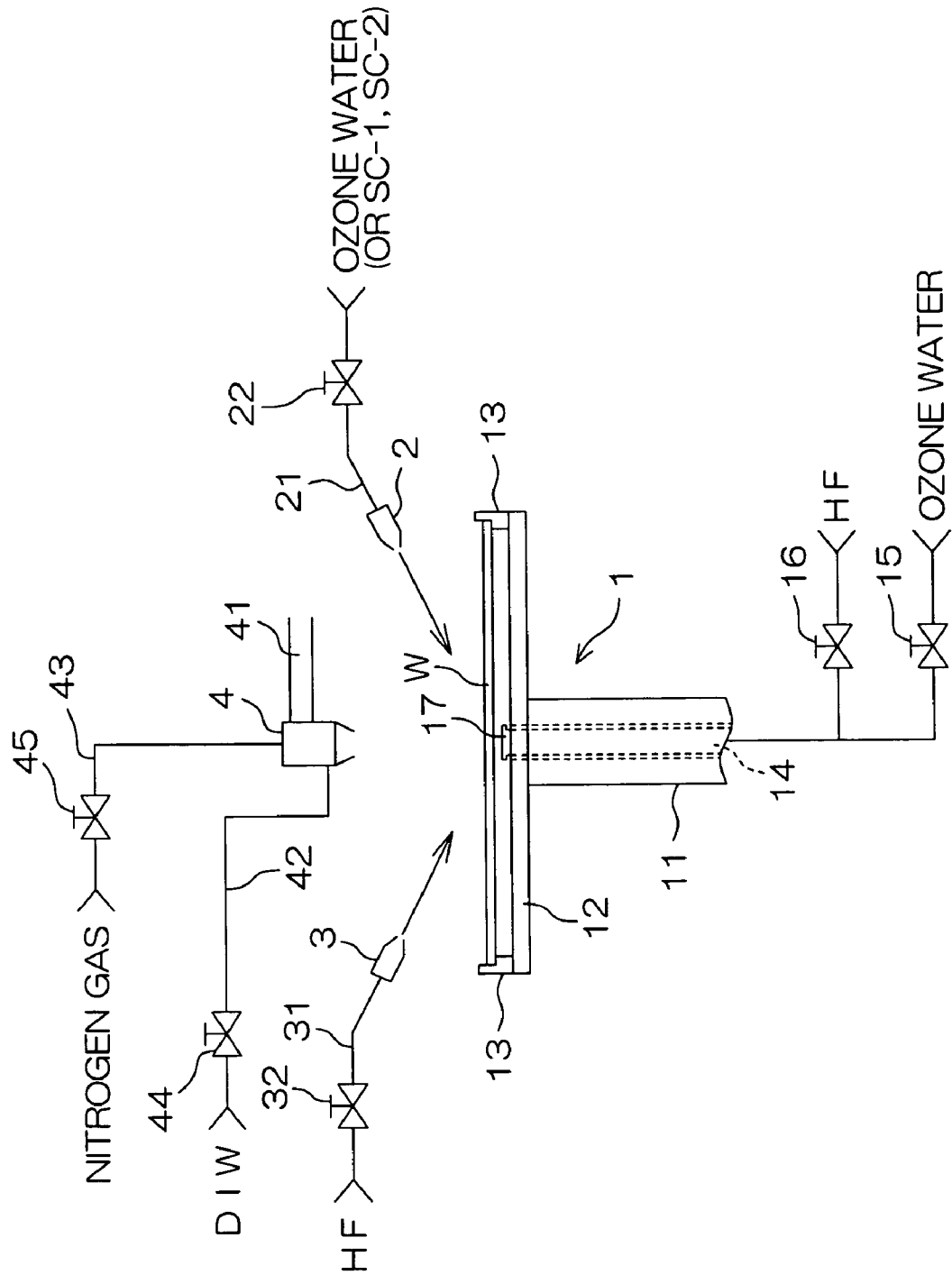
FIG. 1 is a diagram schematically illustrating the construction of a substrate treatment apparatus according to one embodiment of the present invention.

FIG. 1 is a diagram schematically illustrating the construction of a substrate treatment apparatus according to one embodiment of the present invention. This substrate treatment apparatus is adapted to remove unnecessary substances such as particles and metal impurities from a surface of a silicon semiconductor wafer W (hereinafter referred to simply as "wafer") as an example of a substrate. The substrate treatment apparatus comprises a spin chuck 1 for generally horizontally holding the wafer W and rotating the wafer W, an ozone water nozzle 2 for supplying ozone water to an upper surface of the wafer W held by the spin chuck 1, an HF nozzle 3 for supplying a hydrofluoric acid (HF) solution to the upper surface of the wafer W held by the spin chuck 1, and a soft spray nozzle 4 for supplying a jet flow of droplets of deionized water (DIW) to the upper surface of the wafer W held by the spin chuck 1.

The spin chuck 1 includes, for example, a vertical spin shaft 11, a spin base 12 attached to an upper end of the spin shaft 11, and a plurality of chuck pins 13 provided on a peripheral portion of the spin base 12. The plural chuck pins 13 are capable of clamping a peripheral surface of the wafer W to horizontally hold the wafer W. A torque is applied to the spin shaft 11 from a rotative drive mechanism including a motor. The wafer W can be rotated about a vertical axis within a horizontal plane by applying the torque to the spin shaft 11, while being horizontally held by the chuck pins 13.

The spin shaft 11 has a hollow inside through which a treatment liquid supply pipe 14 in the form of a center nozzle is inserted. The treatment liquid supply pipe 14 is adapted to selectively supply the ozone water or an HF solution via a lower surface ozone water valve 15 and a lower surface HF valve 16, respectively. A distal end of the treatment liquid supply pipe 14 is connected to a lower surface nozzle 17 having a plurality of outlet ports located adjacent the center of a lower surface of the wafer W held by the chuck pins 13, so that the ozone water or the HF solution supplied to the treatment liquid supply pipe 14 can be ejected toward the rotation center of the lower surface of the wafer W from the plural outlet ports of the lower surface nozzle 17. In this embodiment, the "upper surface" of the wafer W is defined as a surface formed with a semiconductor device, and the "lower surface" of the wafer W is defined as a surface formed with no semiconductor device. The "surface" of the wafer W is either of the upper and lower surfaces of the wafer W.

An ozone water supply pipe 21 is connected to the ozone water nozzle 2, so that the ozone water can be supplied from the ozone water supply pipe 21. An upper surface ozone water valve 22 for controlling the ejection of the ozone water from the ozone water nozzle 2 is provided in the ozone water supply pipe 21.

An HF supply pipe 31 is connected to the HF nozzle 3, so that the HF solution can be supplied from the HF supply pipe 31. An upper surface HF valve 32 for controlling the ejection of the HF solution from the HF nozzle 3 is provided in the HF supply pipe 31.

The soft spray nozzle 4 provides a physical cleaning effect to the upper surface of the wafer W. The soft spray nozzle 4 is attached to a distal end of an arm 41 which is pivotal within a horizontal plane above the spin chuck 1. A DIW supply pipe 42 and a nitrogen gas supply pipe 43 are connected to the soft spray nozzle 4. The DIW supplied from the DIW supply pipe 42 is ejected from a DIW outlet port provided at a distal end of the soft spray nozzle 4 thereby to flow straight generally vertically downward. On the other hand, high pressure nitrogen gas is supplied from the nitrogen gas supply pipe 43, and ejected at a high speed, for example, from an annular gas outlet port surrounding the DIW outlet port so as to converge on one point (convergence point) on a DIW flow path extending from the DIW outlet port. With this arrangement, when the DIW and the high pressure nitrogen gas are simultaneously supplied to the soft spray nozzle 4, the high pressure nitrogen gas collides with the DIW flowing straight from the DIW outlet port at the convergence point. As a result, a jet flow of droplets of the DIW is generated and supplied to the upper surface of the wafer W. A DIW valve 44 and a nitrogen gas valve 45 are provided in the DIW supply pipe 42 and the nitrogen gas supply pipe 43, respectively.

The HF solution to be ejected from the lower surface nozzle 17 preferably has a concentration of about 1/50 of 50% HF, for example, unlike a diluted HF (DHF) solution (having a concentration of 1/300 of 50% HF) employed as an etching liquid to be supplied to the upper surface of the wafer W. That is, the etching liquid for the lower surface of the wafer W has a higher concentration than the etching liquid for the upper surface of the wafer W. Thus, substantially the same cleaning effect can be provided for the upper and lower surfaces of the wafer W by employing the etching liquid having a higher concentration for the lower surface of the wafer W where provision of a soft spray nozzle is difficult. Where a mechanism for rotating the wafer W while holding the peripheral surface of the wafer W by a plurality of rotation rollers is employed, however, it is possible to provide a soft spray nozzle in the vicinity of the lower surface of the wafer W. Therefore, a DHF solution as employed for the upper surface of the wafer W may be employed for the lower surface of the wafer W.

Figure 2:
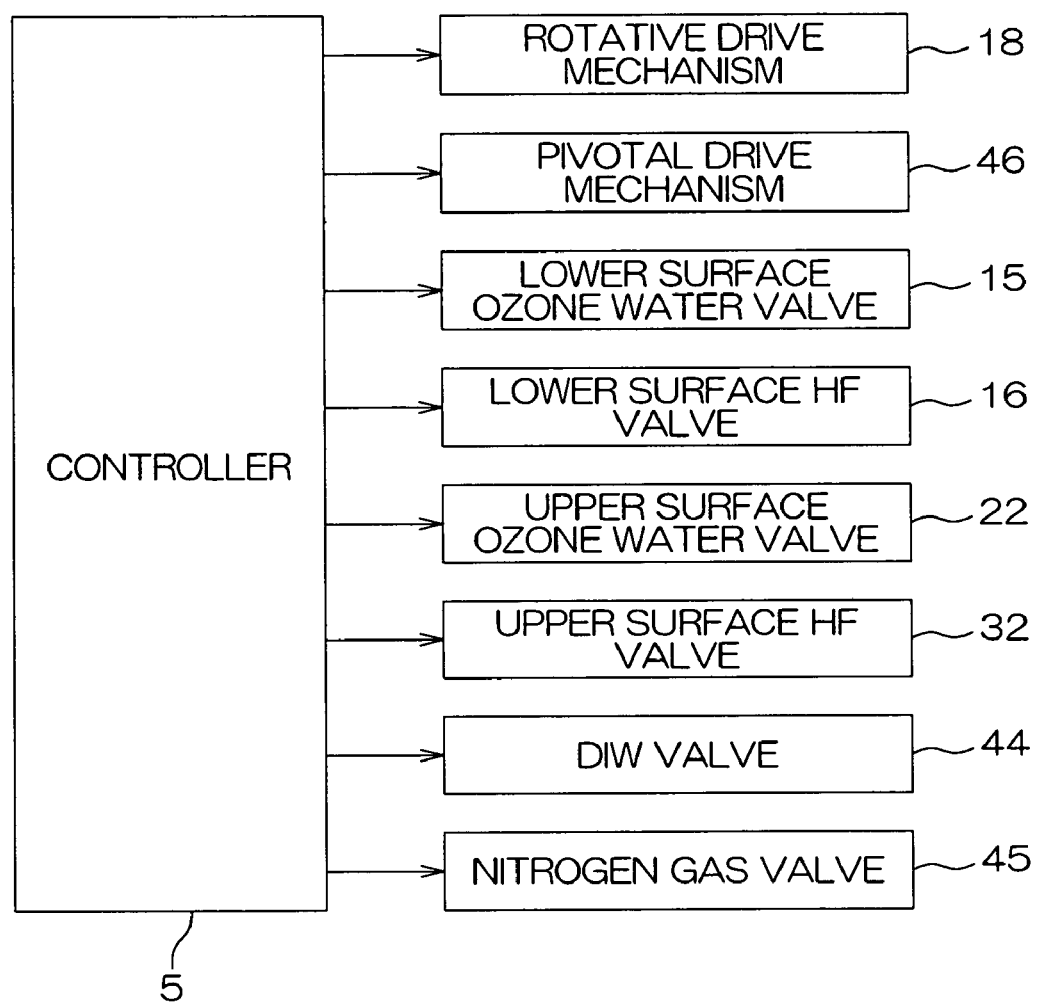
FIG. 2 is a block diagram illustrating the electrical construction of the substrate treatment apparatus.

FIG. 2 is a block diagram illustrating the electrical construction of the substrate treatment apparatus. The substrate treatment apparatus further includes a controller 5, for example, comprising a microprocessor.

The controller 5 is connected to a rotative drive mechanism 18 for rotating the spin chuck 1, a pivotal drive mechanism 46 for pivoting the arm 41 holding the soft spray nozzle 4, the lower surface ozone water valve 15, the lower surface HF valve 16, the upper surface ozone water valve 22, the upper surface HF valve 32, the DIW valve 44 and the nitrogen gas valve 45.

For the treatment of the wafer W, the controller 5 controls the operations of the rotative drive mechanism 18 and the pivotal drive mechanism 46 and the opening and closing of the lower surface ozone water valve 15, the lower surface HF valve 16, the upper surface ozone water valve 22, the upper surface HF valve 32, the DIW valve 44 and the nitrogen gas valve 45 according to a predetermined program.

More specifically, when a wafer W is loaded onto the spin chuck 1 for the treatment of the wafer W, the controller 5 operates the rotative drive mechanism 18 to rotate the spin chuck 1 holding the wafer W at a predetermined rotation speed (e.g., 500 rpm).

Thereafter, the controller 5 opens the upper surface ozone water valve 22 to start supplying the ozone water to the upper surface of the wafer W from the ozone water nozzle 2. The ozone water from the ozone water nozzle 2 is supplied toward the rotation center of the wafer W, and spreads from the supply position in the vicinity of the rotation center toward the peripheral edge of the wafer W by a centrifugal force generated by the rotation of the wafer W. Thus, the ozone water flows over the entire upper surface of the wafer W, whereby metal impurities on the upper surface of the wafer W are oxidized by the ozone water. That is, the metal impurities on the upper surface of the wafer W are oxidized by the ozone water into a state such as to be more easily etched away. The supply of the ozone water is continued, for example, for four seconds.

The controller 5 opens the DIW valve 44 and the nitrogen gas valve 45 simultaneously with the opening of the upper surface ozone water valve 22 or with a predetermined time lag (e.g., three seconds) from the opening of the ozone water valve 22 to start supplying the jet flow (soft spray) of the DIW droplets to the upper surface of the wafer W from the soft spray nozzle 4. At this time, the controller 5 operates the pivotal drive mechanism 46 to reciprocally pivot the arm 41 within a predetermined angle range. Thus, the jet flow supply position on the upper surface of the wafer W to which the droplet jet flow is supplied from the soft spray nozzle 4 is reciprocally scanned along an arcuate path within a range from the rotation center of the wafer W to the peripheral edge of the wafer W.

The droplet jet flow to be supplied from the soft spray nozzle 4 is generated by the high pressure nitrogen gas supplied from the nitrogen gas supply pipe 43 and, hence, has a great kinetic energy (flow speed). The supply of the droplet jet flow having the great kinetic energy to the upper surface of the wafer W makes it possible to physically remove the particles from the supply position of the droplet jet flow. By scanning the supply position, the particles can physically be removed from virtually the entire upper surface of the wafer W. The treatment with the soft spray (for the physical removal of the particles) is continued, for example, for six seconds.

While performing the treatment with the ozone water and the soft spray, the controller 5 opens the lower surface ozone water valve 15 to supply the ozone water to the lower surface of the wafer W from the lower surface nozzle 17. The ozone water supplied to the lower surface of the wafer W from the lower surface nozzle 17 spreads from the supply position in the vicinity of the rotation center toward the peripheral edge of the wafer W by the centrifugal force generated by the rotation of the wafer W. Thus, the ozone water flows over virtually the entire lower surface of the wafer W, whereby the lower surface of the wafer W is oxidized by the ozone water. The supply of the ozone water to the lower surface of the wafer W is continued, for example, for ten seconds.

After the treatment of the upper surface of the wafer W with the ozone water and the soft spray and the treatment of the lower surface of the wafer W with the ozone water are simultaneously performed, the upper and lower surfaces of the wafer W are treated with the HF solution. That is, the controller 5 opens the upper surface HF valve 32 to supply the HF solution to the upper surface of the wafer W from the HF nozzle 3, and opens the lower surface HF valve 16 to supply the HF solution to the lower surface of the wafer W from the lower surface nozzle 17. The HF solution supplied to the upper and lower surfaces of the wafer W spreads from the supply positions in the vicinity of the rotation center toward the peripheral edge of the wafer W by the centrifugal force generated by the rotation of the wafer W. Thus, the HF solution flows over virtually the entire upper and lower surfaces of the wafer W, whereby the metal impurities and the particles are etched away from the upper and lower surfaces of the wafer W and the metal impurities adhering on the upper and lower surfaces of the wafer W are dissolved away.

The period of the supply of the HF solution to the upper and lower surfaces of the wafer W is preferably determined so that the metal impurities oxidized by the ozone water can be etched away and the amount of the etching of an underlying natural oxide film can be minimized (reduced to not greater than 10 Å, preferably 0 to 5 Å, more preferably 1 to 2 Å). Where the periods of the supply of the ozone water to the upper and lower surfaces of the wafer W are set as described above, and the ozone water and the HF solution respectively have a concentration of 20 ppm and a concentration of 1/300 of 50% HF, for example, the period of the supply of the HF solution to the upper and lower surfaces of the wafer W is ten seconds.

The respective processes described above are repeated a plurality of times. That is, the process of treating the upper surface of the wafer W with the ozone water and the soft spray and treating the lower surface of the wafer W with the ozone water and the process of treating the upper and lower surfaces of the wafer W with the HF solution are alternately repeated the plurality of times. Thus, the unnecessary substances such as the particles and the metal impurities are cleanly removed from the surfaces of the wafer W. Depending on the degree of the contamination of the wafer W, these processes are not necessarily required to be repeated the plurality of times, but may be performed once. However, these processes are preferably repeated two to ten times, for example, for improvement of the cleaning effect.

After the removal of the unnecessary substances, the DIW is supplied to the upper and lower surfaces of the wafer W to rinse away the HF solution (or the ozone water) remaining on the upper and lower surfaces of the wafer W while the spin chuck 1 is continuously rotated. The supply of the DIW to the upper and lower surfaces of the wafer W may be achieved, for example, by an upper surface DIW nozzle (not shown) disposed above the wafer W and a lower surface DIW nozzle (not shown) disposed below the wafer W. Alternatively, the supply of the DIW to the upper surface of the wafer W may be achieved by opening only the DIW valve 44 under the control of the controller 5 for ejecting the DIW from the soft spray nozzle 4, and the supply of the DIW to the lower surface of the wafer W may be achieved by connecting a DIW supply source to the lower surface nozzle 17 via a valve through the same piping system as employed for the supply of the HF solution and the ozone water and ejecting the DIW from the lower surface nozzle 17.

Upon completion of the rinsing process with the DIW, the controller 5 controls the rotative drive mechanism 18 to rotate the spin chuck 1 at a high rotation speed for a predetermined drying period. Thus, the DIW is spun off from the upper and lower surfaces of the wafer W by a centrifugal force, whereby the upper and lower surfaces of the wafer W are dried. After completion of the drying process, the rotation of the spin chuck 1 is stopped and the treated wafer W is unloaded from the spin chuck 1.

According to this embodiment, the application of the soft spray is started with the predetermined time lag from the start of the supply of the ozone water to the upper surface of the wafer W for supplying the jet flow to the upper surface of the wafer W from the soft spray nozzle 4 simultaneously with the supply of the ozone water, whereby the particles are physically removed by the soft spray. Thus, the metal impurities and the particles can advantageously be removed from the upper surface of the wafer W even with a reduced amount of the etching of the upper surface of the wafer W by the HF solution. Since the amount of the etching by the HF solution is reduced, the time required for the etching by the HF solution and the concentration of the HF solution can be reduced.

Further, there is no need for etching the surface of the wafer W to a greater depth. Accordingly, a diluted HF (DHF) solution having a concentration of about 1/300 to 1/200 of 49 to 50% HF can be employed as the HF solution to be supplied to the upper surface of the wafer W, so that the over-etching of the upper surface of the wafer W can be prevented. Therefore, the particles once removed in the HF solution are unlikely to adhere again on an underlying hydrophobic base (bare silicon) of the wafer which may otherwise be exposed from the natural oxide film of the wafer W by the over-etching.

While one embodiment of the present invention has thus been described, the present invention may be embodied in any other ways. Although the ozone water is employed as the oxidation liquid for oxidizing the metal impurities on the surface of the wafer W in the embodiment described above, any oxidative liquid may be used as the oxidation liquid. For example, a treatment liquid such as an SC-1 solution ($NH_4OH+H_2O_2+H_2O$) or an SC-2 solution ($HCl+H_2O_2+H_2O$) containing hydrogen peroxide may be used.

For improvement of the effect of removing the metal impurities from the surface of the wafer W, hydrochloric acid, nitric acid or an organic acid (citric acid, oxalic acid, acetic acid or the like) may be mixed in the oxidation liquid.

Although the HF solution is employed as the etching liquid for etching away the metal impurities from the surface of the wafer W in the embodiment described above, the etching liquid is merely required to contain HF. Other examples of the etching liquid to be used include a mixture of HF, HCl and $H_2O$, and a mixture of HF, $H_2O_2$ and $H_2O$. Further, a BHF (buffered hydrofluoric acid) solution may be employed. Where the wafer W has an $SiO_2$ surface, a DHF (diluted hydrofluoric acid) solution is preferably used. Where virtually no etching is required, an alkaline solution such as an $NH_4OH$ solution or the SC-1 solution may be employed.

Although the physical cleaning process utilizing the physical energy of the DIW supplied from the soft spray nozzle is performed partly simultaneously with the process of oxidizing the upper surface of the wafer W by the supply of the ozone water in the embodiment described above, the oxidation process and the physical cleaning process may separately be performed. For example, the physical cleaning process may be performed after the oxidation process or, conversely, the oxidation process may be performed after the physical cleaning process.

In the embodiment described above, the oxidation process with the ozone water and the physical cleaning process with the soft spray are performed at the initial stage of the treatment, but the etching process with the HF solution may be performed prior to the oxidation process and the physical cleaning process. That is, the etching process may first be performed, and then the process sequence including the oxidation process, the physical cleaning process and the etching process may be performed.

Figure 3:
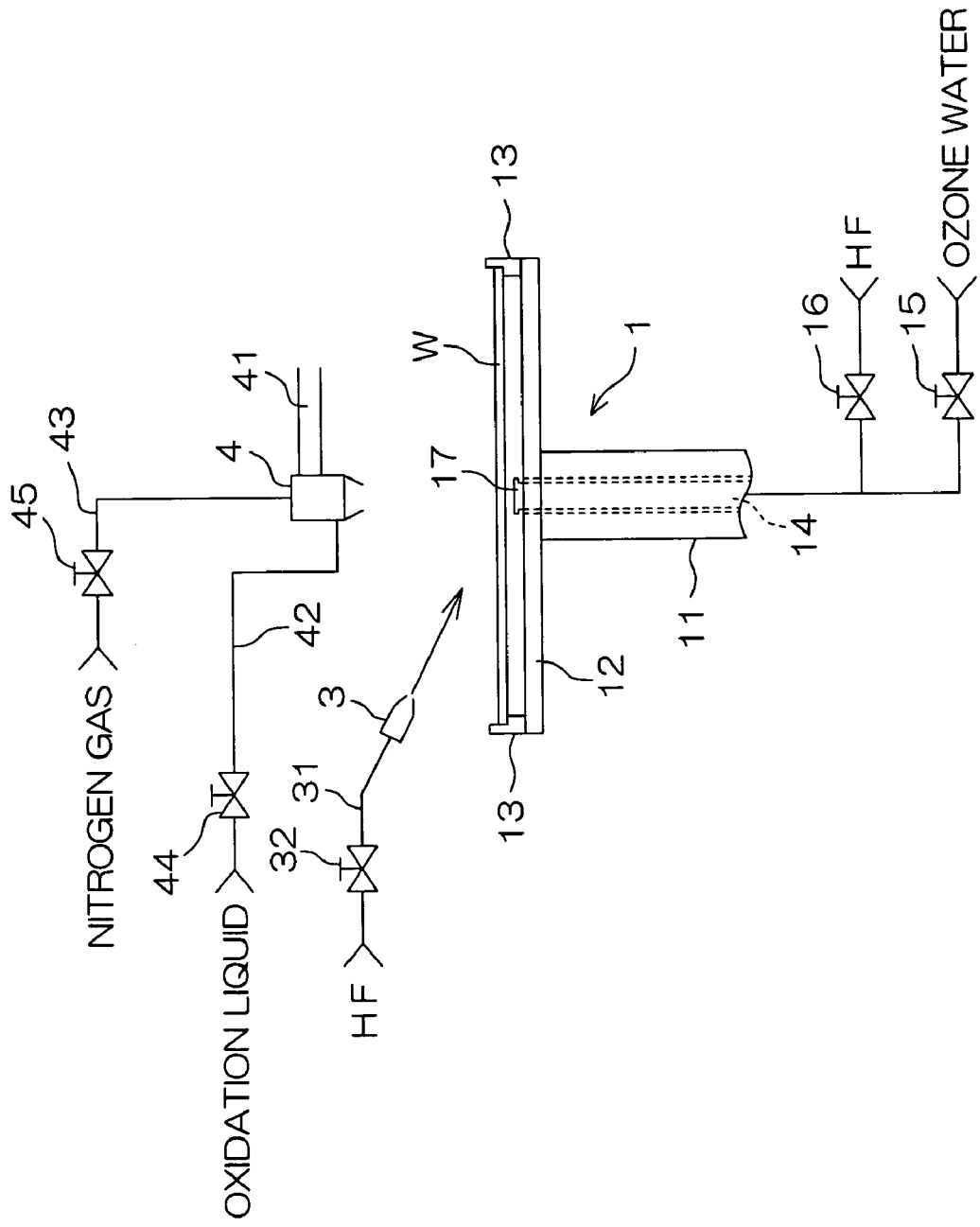
FIG. 3 is a diagram schematically illustrating the construction of a substrate treatment apparatus according to another embodiment of the present invention.

The substrate treatment apparatus according to the embodiment described above is constructed so that the DIW droplet jet flow is ejected from the soft spray nozzle 4 as shown in FIG. 3. Alternatively, the oxidation liquid such as the ozone water, the SC-1 solution, the SC-2 solution or the diluted $NH_4OH$ aqueous solution may be supplied to the soft spray nozzle 4, so that a jet flow of droplets of the oxidation liquid can be ejected from the soft spray nozzle 4. In this case, the provision of the ozone water nozzle 2 may be obviated, whereby the construction can be simplified.

Figure 4:
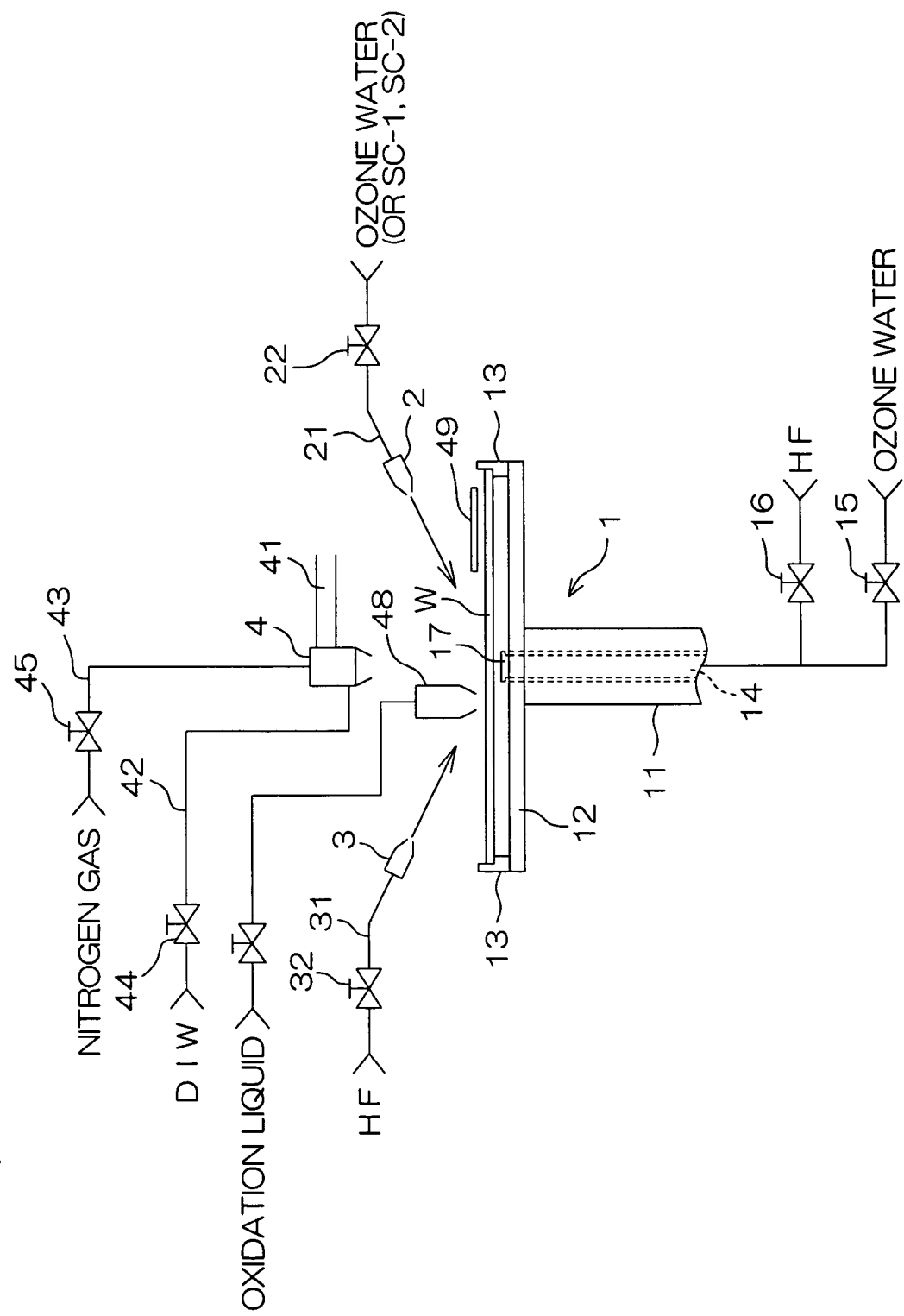
FIG. 4 is a diagram schematically illustrating the construction of a substrate treatment apparatus according to further another embodiment of the present invention.

As shown in FIG. 4, an ultrasonic nozzle 48 for supplying the DIW or the oxidation liquid imparted with ultrasonic vibration to the upper surface of the wafer W or a rod-shaped or plate-shaped ultrasonic vibrator 49 to be brought into contact with a film of the treatment liquid supplied onto the upper surface of the substrate for imparting ultrasonic vibration to the treatment liquid may be provided instead of the soft spray nozzle 4 or together with the soft spray nozzle 4. With this arrangement, the particles can physically be removed from the upper surface of the wafer W by the ultrasonic vibration imparted to the DIW or the oxidation liquid. Further, a brush for scrubbing the upper surface of the wafer W may be provided, so that the particles can physically be removed from the upper surface of the wafer W by the brush.

The drying process for drying the wafer W after the treatment is not limited to the spin-off drying process utilizing the high-speed rotation of the wafer W (spin chuck 1), but may be performed by spraying air onto the wafer W from an air knife to blow off the water from the wafer W, or by supplying IPA (isopropyl alcohol) vapor or liquid IPA onto the wafer W to evaporate (vaporize) the IPA together with the water. Alternatively, an ambient pressure around the wafer W may be reduced for the drying of the wafer W (reduced pressure drying), or super critical carbon dioxide ($SCCO_2$) may be supplied to the surface of the wafer W for the drying of the wafer W ($SCCO_2$ drying).

While the present invention has been described in detail by way of the embodiments thereof, it should be understood that the foregoing disclosure is merely illustrative of the technical principles of the present invention but not limitative of the same. The spirit and scope of the present invention are to be limited only by the appended claims.

This application corresponds to Japanese Patent Application No. 2002-237586 filedwith the Japanese Patent Office on Aug. 16, 2002, the disclosure of which is incorporated herein by reference.

What is claimed is:

1. A substrate treatment apparatus for removing an unnecessary substance from a surface of a substrate, the apparatus comprising:
    an oxidation liquid supply mechanism including an oxidation liquid nozzle for supplying an oxidation liquid having an oxidative effect to the substrate surface;
    a physical cleaning mechanism including a dual fluid spray nozzle generating a jet flow of droplets of a deionized water and supplying the jet flow to the substrate surface, the dual fluid spray nozzle having a deionized water outlet port ejecting the deionized water towards the surface of the substrate and a gas outlet port blowing a gas onto the deionized water ejected through the deionized water outlet port, the dual fluid spray nozzle being provided separately from the oxidation liquid nozzle;
    an etching liquid supply mechanism including an etching liquid nozzle for supplying an etching liquid having an etching effect to the substrate surface; and
    a cleaning controller programmed to control the oxidation liquid supply mechanism and the physical cleaning mechanism, to generate and supply the jet flow of droplets of the deionized water to the substrate surface from the dual fluid spray nozzle simultaneously with supplying the oxidation liquid to the substrate surface from the oxidation liquid nozzle for a period of time, so as to perform physical cleaning of the substrate surface while simultaneously supplying said oxidation liquid to the substrate surface.

2. A substrate treatment apparatus as set forth in claim 1, wherein the physical cleaning mechanism further includes an ultrasonic mechanism for imparting ultrasonic vibration to a treatment liquid supplied or to be supplied to the substrate surface.

3. A substrate treatment apparatus as set forth in claim 1, wherein the oxidation liquid supply mechanism supplies a treatment liquid comprising ozone water as the oxidation liquid to the substrate surface from the oxidation liquid nozzle.

4. A substrate treatment apparatus as set forth in claim 1, wherein the oxidation liquid supply mechanism supplies a treatment liquid comprising hydrogen peroxide as the oxidation liquid to the substrate surface from the oxidation liquid nozzle.

5. A substrate treatment method for removing an unnecessary substance from a surface of a substrate, the substrate treatment method comprising the steps of:
    supplying an oxidation liquid from an oxidation liquid nozzle, the oxidation liquid having an oxidative effect to the substrate surface for oxidizing metal impurities on the substrate surface;
    generating a jet flow of droplets of a deionized water by ejecting the deionized water towards the surface of the substrate through a deionized water outlet port of a dual fluid spray nozzle and blowing a gas through a gas outlet port of the dual fluid spray nozzle onto the deionized water ejected through the deionized water outlet port, the dual fluid spray nozzle being provided separately from the oxidation liquid nozzle;
    physically cleaning the substrate surface by supplying the generated jet flow of droplets of the deionized water to the substrate surface from the dual fluid spray nozzle; and
    supplying an etching liquid having an etching effect to the substrate surface for etching the substrate surface after the oxidation step and the physical cleaning step,
    wherein the supplying of the generated jet flow of droplets of the deionized water from the dual fluid spray nozzle is carried out simultaneously with the supplying of the oxidation liquid from the oxidation liquid nozzle for a period of time, so as to perform physical cleaning of the substrate surface while simultaneously supplying said oxidation liquid to the substrate surface.

6. A substrate treatment method as set forth in claim 5, wherein the oxidation step, the physical cleaning step and the etching step are repeated a plurality of times.

7. A substrate treatment method as set forth in claim 5, wherein the etching step is carried out for a period sufficient to etch away the metal impurities oxidized in the oxidation step.

8. A substrate treatment method as set forth in claim 5, wherein said oxidation liquid contains ozone water.

9. A substrate treatment method as set forth in claim 8, wherein said oxidation liquid further contains an additive selected from the group consisting of hydrochloric acid, nitric acid and an organic acid.

10. A substrate treatment method as set forth in claim 5, wherein said oxidation liquid contains hydrogen peroxide.

11. A substrate treatment method as set forth in claim 10, wherein said oxidation liquid is SC-1 or SC-2.

12. A substrate treatment method as set forth in claim 10, wherein said oxidation liquid further contains an additive selected from the group consisting of hydrochloric acid, nitric acid and an organic acid.

13. A substrate treatment method as set forth in claim 5, wherein said etching liquid contains HF.

14. A substrate treatment method as set forth in claim 13, wherein said etching liquid further contains HCl or $H_2O_2$.

15. A substrate treatment method as set forth in claim 5, wherein said etching liquid contains $NH_4OH$ or SC-1.

* * * * *